United States Patent
Mantha et al.

(10) Patent No.: US 12,301,194 B2
(45) Date of Patent: May 13, 2025

(54) ADJUSTABLE RADIO-FREQUENCY SPLITTER-COMBINER

(71) Applicant: Apple Inc., Cupertino, CA (US)

(72) Inventors: Soumya Mantha, San Jose, CA (US); Woorim Shin, Palo Alto, CA (US)

( * ) Notice: Subject to any disclaimer, the term of this patent is extended or adjusted under 35 U.S.C. 154(b) by 0 days.

(21) Appl. No.: 18/462,391

(22) Filed: Sep. 6, 2023

(65) Prior Publication Data

US 2024/0080018 A1 Mar. 7, 2024

Related U.S. Application Data

(63) Continuation of application No. 17/900,249, filed on Aug. 31, 2022.

(51) Int. Cl.
*H03H 11/28* (2006.01)
*H01P 5/12* (2006.01)
*H01Q 1/50* (2006.01)

(52) U.S. Cl.
CPC ............ *H03H 11/28* (2013.01); *H01P 5/12* (2013.01); *H01Q 1/50* (2013.01)

(58) Field of Classification Search
CPC ... H01P 5/12; H01Q 1/50; H01Q 3/26; H03H 11/28; H03H 7/48
See application file for complete search history.

(56) References Cited

U.S. PATENT DOCUMENTS

| | | | |
|---|---|---|---|
| 7,525,396 B2 | 4/2009 | He et al. | |
| 9,572,792 B2 * | 2/2017 | Heidelbaugh | A61P 27/06 |
| 10,910,714 B2 | 2/2021 | Ku et al. | |
| 11,678,925 B2 * | 6/2023 | Henderson | H04L 49/25 606/34 |
| 2014/0179239 A1 * | 6/2014 | Nickel | H04B 17/12 455/67.14 |
| 2014/0341262 A1 * | 11/2014 | Allen | H04L 25/0292 375/220 |
| 2020/0006849 A1 | 1/2020 | Zhu et al. | |

(Continued)

OTHER PUBLICATIONS

J.D. Dunworth et al., A 28GHz Bulk-CMOS Dual-Polarization Phased-Array Transceiver with 24 Channels for 5G User and Basestation Equipment, IEEE International Solid-State Circuits Conference, 2018, pp. 70-72, IEEE, New York, NY, United States.

*Primary Examiner* — Thien M Le
(74) *Attorney, Agent, or Firm* — Treyz Law Group, P.C.; Tianyi He

(57) ABSTRACT

An electronic device may include wireless circuitry with a processor, a transceiver circuit, a front-end module, and an antenna array having multiple antennas. The front-end module may include radio-frequency splitter-combiner circuitry that splits radio-frequency signals from a single port into multiple radio-frequency signals at multiple split ports and/or combines radio-frequency signals from the multiple ports into radio-frequency signals at the single combined port. The radio-frequency splitter-combiner may include adjustable components such as switches, adjustable inductors, and/or adjustable capacitors that place the radio-frequency splitter-combiner in different configurations based on whether or not there are inactive split ports coupled to inactive antennas. This enables improved impedance matching for active split ports even while one or more split ports remain inactive, thereby reducing power loss in this mode of operation.

20 Claims, 7 Drawing Sheets

(56) References Cited

U.S. PATENT DOCUMENTS

| | | | |
|---|---|---|---|
| 2020/0366259 A1* | 11/2020 | Sun | H01L 23/49503 |
| 2021/0027992 A1* | 1/2021 | Funk | H03F 3/602 |
| 2022/0077574 A1* | 3/2022 | Hu | H01Q 7/00 |
| 2022/0216927 A1* | 7/2022 | Gallhauser | H04B 17/23 |
| 2022/0311467 A1* | 9/2022 | Agah | H04B 1/1081 |
| 2023/0030569 A1* | 2/2023 | Kim | H01P 5/16 |
| 2023/0074626 A1* | 3/2023 | Campbell | H01P 5/186 |
| 2023/0387998 A1* | 11/2023 | Li | H04B 7/0413 |

* cited by examiner

ADJUSTABLE RADIO-FREQUENCY SPLITTER-COMBINER

This application is a continuation of U.S. patent application Ser. No. 17/900,249, filed Aug. 31, 2022, which is incorporated by reference herein in its entirety.

FIELD

This application relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless transceiver circuitry in the wireless communications circuitry uses the antennas to transmit and receive radio-frequency signals.

Signals transmitted and received by the antennas can pass through a radio-frequency front-end module, which can include a radio-frequency splitter-combiner for splitting radio-frequency signals into the multiple radio-frequency signals for transmission and for combining the multiple received radio-frequency signals. It can be challenging to design satisfactory radio-frequency splitter-combiner circuitry for an electronic device.

SUMMARY

An electronic device may include wireless circuitry with a processor, a transceiver circuit, a front-end module, and an antenna array having multiple antennas. The front-end module may include radio-frequency splitter-combiner circuitry that splits radio-frequency signals from a single port into multiple radio-frequency signals at multiple split ports and/or combines radio-frequency signals from the multiple ports into radio-frequency signals at the single combined port. The radio-frequency splitter-combiner may include adjustable components such as switches, adjustable inductors, and/or adjustable capacitors that place the radio-frequency splitter-combiner in different configurations based on whether or not there are inactive split ports coupled to inactive antennas. This enables improved impedance matching for active split ports even while one or more split ports remain inactive, thereby reducing power loss in this mode of operation.

As an example, the radio-frequency splitter-combiner circuitry may include an adjustable one-to-two splitter-combiner having one combined port and two split ports. A split path may couple the combined port to each of the two split ports. A quarter wave impedance transformer having an impedance of the characteristic impedance (of the transmission line) multiplied by the square root of two may be provided along each of the two split paths. A switch may be coupled in parallel with the quarter wave impedance transformer. A resistor may couple the two split ports to each other. A switch may be coupled in series with the resistor. A switch may also couple each split port to a ground voltage terminal. As another example, the radio-frequency splitter-combiner circuitry may include an adjustable one-to-two splitter-combiner formed using lumped elements such as inductors and capacitors. These inductors and capacitors may exhibit variable capacitance and/or may have switches coupled in parallel and/or in series with each of the inductors and capacitors. If desired, multiple of these one-to-two splitter-combiners be coupled serially and/or in parallel to generally form an adjustable one-to-N splitter-combiner, N being any suitable natural number.

An aspect of the disclosure provides a radio-frequency splitter-combiner. The radio-frequency splitter-combiner can include a first impedance transformer coupling a first port of the radio-frequency splitter-combiner to a second port of the radio-frequency splitter-combiner, a second impedance transformer coupling the first port to a third port of the radio-frequency splitter-combiner, a resistor, and a switch coupled in series with the resistor between the second port and the third port. In one illustrative arrangement, the first impedance transformer can include a first quarter wave impedance transformer and the second impedance transformer may include a second quarter wave impedance transformer. The radio-frequency splitter-combiner can further include a second switch coupled in parallel with the first quarter wave impedance transformer between the first port and the second port, a third switch coupled in parallel with the second quarter wave impedance transformer between the first port and the third port, a fourth switch coupling the second port to a reference voltage terminal, a fifth switch coupling the third port to the reference voltage terminal.

An aspect of the disclosure provides radio-frequency splitter-combiner circuitry. The radio-frequency splitter-combiner circuitry can include first impedance matching circuitry coupling a first port of the radio-frequency splitter-combiner circuitry to a second port of the radio-frequency splitter-combiner circuitry, second impedance matching circuitry coupling the first port to a third port of the radio-frequency splitter-combiner circuitry, a resistor coupled between the second port and the third port, a first switch coupled across the first impedance matching circuitry, and a second switch coupled across the second impedance matching circuitry.

An aspect of the disclosure provides wireless circuitry. The wireless circuitry can include a phased antenna array having a plurality of antennas, and a radio-frequency splitter-combiner having a combined port and a plurality of split ports, each split port being coupled to a corresponding antenna in the plurality of antennas. The radio-frequency splitter-combiner can include impedance matching circuitry coupled to each split port in the plurality of split ports, a resistor coupled to each pair in at least some pairs of split ports in the plurality of split ports, and switching circuitry coupled to the impedance matching circuitry and the resistor. If desired, the radio-frequency splitter-combiner can include a plurality of one-to-two splitter-combiner stages, each stage including at least a portion of the impedance matching circuitry, at least one of the resistors, and at least a portion of the switching circuitry. The wireless circuitry can include one or more processors configured to provide one or more control signals to the switching circuitry based at least in part on any antennas in the plurality of antennas that are not in use.

DETAILED DESCRIPTION

Figure 1:
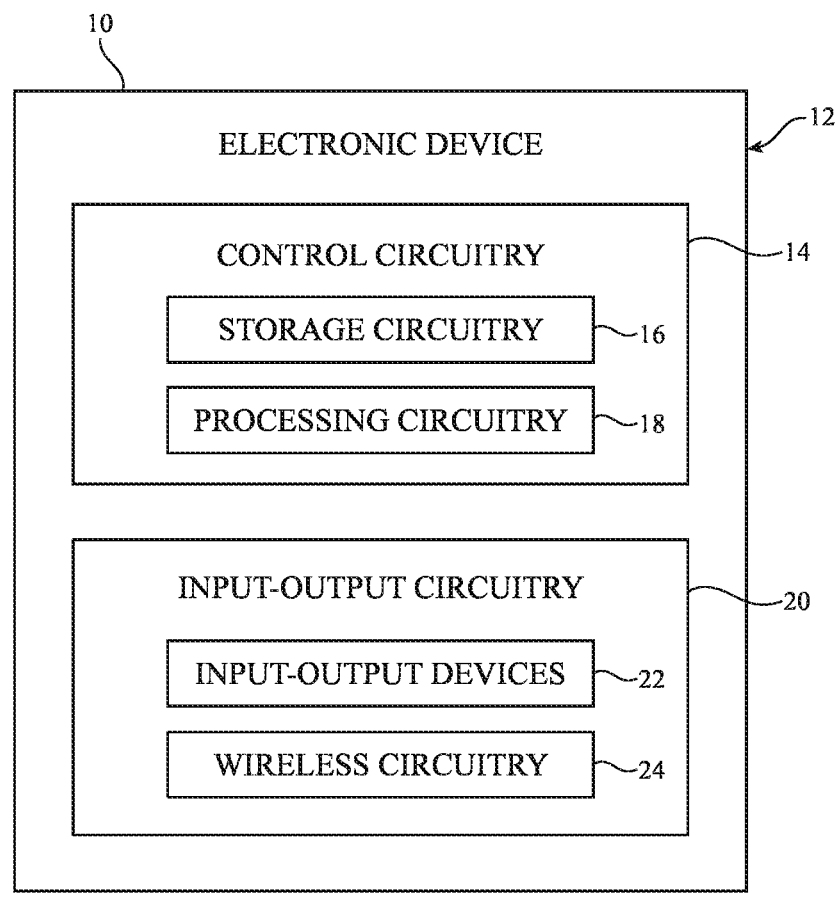
FIG. 1 is a diagram of an illustrative electronic device having wireless circuitry in accordance with some embodiments.

An electronic device such as electronic device 10 of FIG. 1 may be provided with wireless circuitry. The wireless circuitry may include radio-frequency (power) combiner circuitry that combines multiple radio-frequency signals from multiple ports into combined radio-frequency signals at a single port and/or radio-frequency (power) splitter circuitry that splits combined radio-frequency signals at a single port into multiple radio-frequency signals at multiple ports. Circuitry that serves as a radio-frequency combiner, such as for a radio-frequency signal reception operation, may also serve as a radio-frequency splitter, such as for a radio-frequency signal transmission operation. Accordingly, a radio-frequency combiner without being configured as a splitter, a radio-frequency splitter without being configured as a combiner, and a radio-frequency splitter that also serves as a combiner are each referred to herein generally as a radio-frequency splitter/combiner, radio-frequency splitter-combiner circuitry, a radio-frequency splitter-combiner, or simply a splitter-combiner.

A radio-frequency splitter-combiner may include adjustable components such as one or more switches that configure the radio-frequency splitter-combiner in different states for different modes of operation. In particular, the adjustable radio-frequency splitter-combiner may be configured in a first state when all of its split ports (e.g., leaves) are active and may be configured in a second state when one or more of its split ports (e.g., leaves) are inactive. Configured in the second state, the radio-frequency splitter-combiner may exhibit lower power loss at one or more of the active split ports while one or more of the other split ports are inactive. One or more adjustable radio-frequency splitters-combiners having multiple configurable states can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry or other processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
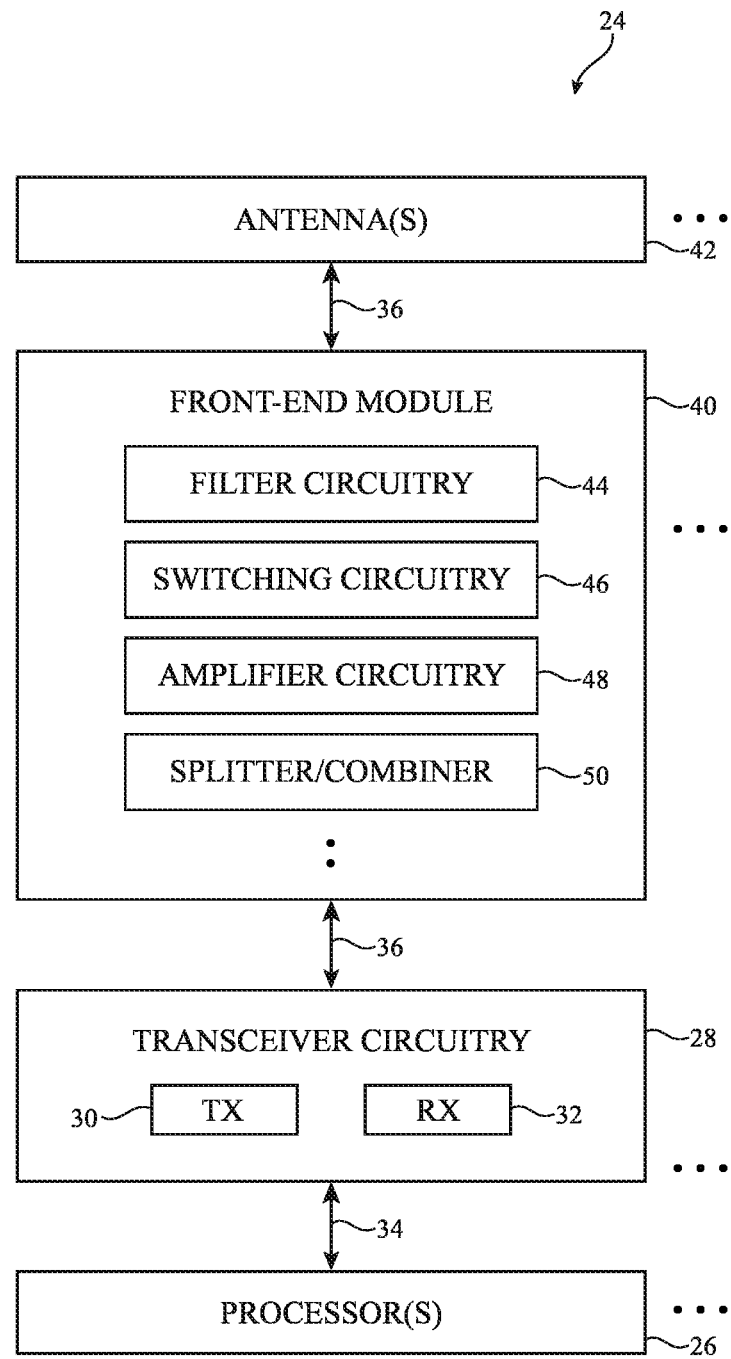
FIG. 2 is a diagram of illustrative wireless communications circuitry having a radio-frequency splitter and/or combiner in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be disposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 28, any desired number of front end modules 40, and any desired number of antennas 42. Each processor 26 may be coupled to one or more transceiver 28 over respective paths 34. Each transceiver 28 may include a transmitter circuit 30 configured to output uplink signals to antenna 42, may include a receiver circuit 32 configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. FEM 40 may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifier circuits and/or one or more low-noise amplifier circuits), radio-frequency splitter and/or combiner 50 (sometimes referred to herein as radio-frequency splitter-combiner circuitry 50, or radio-frequency splitter-combiner 50), radio-impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

As described above, front end module 40 may include one or more radio-frequency (power) splitter-combiners 50. A radio-frequency splitter-combiner 50 may be a radio-frequency splitter or divider in the transmit (uplink) path that splits radio-frequency signals on a single radio-frequency transmission path into multiple radio-frequency signals on respective split radio-frequency transmission paths ultimately conveyed to corresponding multiple antenna elements for transmission, may be a radio-frequency combiner in the receive (downlink) path that combines multiple radio-frequency signals on respective split radio-frequency transmission paths received using corresponding multiple antenna elements into combined radio-frequency signals on a single radio-frequency transmission path, may be circuitry that performs both radio-frequency splitter functions (in the transmit path) and radio-frequency combiner functions (in the receive path), or may be a radio-frequency splitter and/or combiner in other configurations within front end module 40. If desired, one or more radio-frequency splitter-combiners 50 may be provided elsewhere in wireless circuitry 24 such as within transceiver circuitry 28.

While a radio-frequency splitter-combiner may exhibit minimal power loss (e.g., below a certain threshold level) when conveying signals between its combined port and its split ports when each of the split ports is active, the presence of any unused or inactive split ports may cause the radio-frequency splitter-combiner to exhibit less desirable power loss characters (e.g., a power loss of 3 dB in a one-to-two (1:2) splitter-combiner operating with one active split port and one unused split port when compared to operating with two active split ports). To make up for the power loss, the wireless circuitry may undesirably consume excess power. For example, additional power may be consumed at one or more proceeding amplifier stages to supply radio-frequency signals with sufficient power as input to the radio-frequency splitter-combiner. It may therefore be desirable for radio-frequency splitter-combiner to be configured to exhibit minimal power loss even when one or more of its split ports are unused or inactive.

Figure 3:
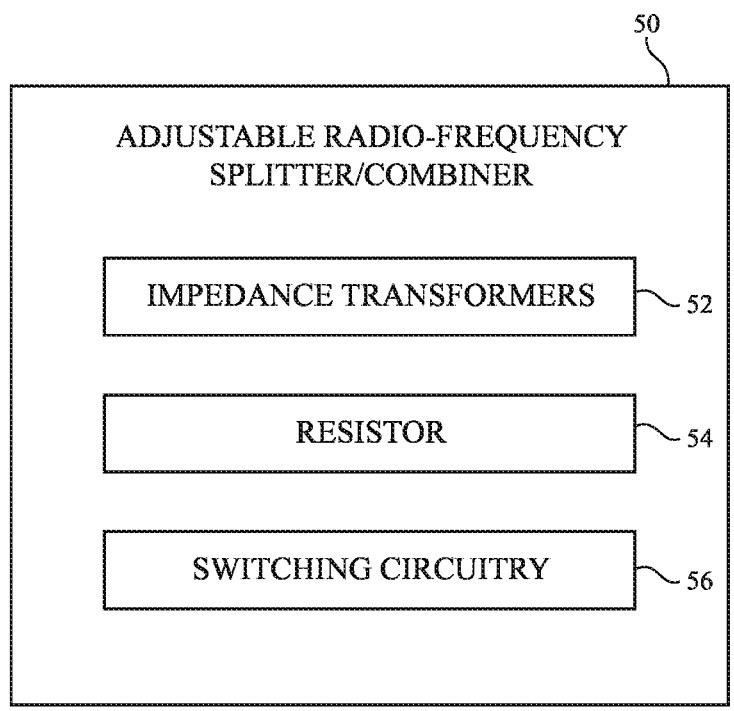
FIG. 3 is a schematic diagram of an illustrative adjustable radio-frequency splitter and/or combiner in accordance with some embodiments.

FIG. 3 is a schematic diagram of an illustrative radio-frequency splitter and/or combiner 50 that is adjustable or configurable (sometimes referred to herein as adjustable radio-frequency splitter-combiner circuitry or an adjustable radio-frequency splitter-combiner). As shown in FIG. 3, radio-frequency splitter-combiner 50 may include one or more impedance transformers 52, resistor 54, and switching circuitry 56.

Radio-frequency splitter-combiner 50 may include a merged or combined input-output port and may include a suitable number (e.g., two) of split output-input ports coupled to the combined input-output port via split paths. Impedance matching circuitry such as impedance transformer 52 may be coupled along each of the split paths to provide impedance matching between the load impedance of each split path and the characteristic impedance of combined path, thereby minimizing power loss when conveying signals between the combined path and the split paths.

As an example, impedance matching circuitry such as impedance transformer 52 may be formed from a quarter wave impedance transformer such as a conductive strip of material having a length that is a quarter of the effective wavelength of operation (e.g., the wavelength of operation taking into account surrounding dielectric material effects) of the wireless system and exhibiting a desired impedance (e.g., the characteristic impedance of the input-output transmission line multiplied by the square root of two). If desired, impedance matching circuitry such as impedance transformer 52 may be formed using lumped elements or discrete components such as inductors and/or capacitors forming an L matching network, a Pi matching network, a T matching network, or other impedance matching networks.

In some illustrative configurations described herein as an illustrative example, radio-frequency splitter-combiner 50 may be a Wilkinson (power) splitter-combiner. In these Wilkinson-type configurations or in other configurations, radio-frequency splitter-combiner 50 may include a resistor such as resistor 54 that couples the split ports to each other. Resistor 54 may have a resistance that is twice the characteristic impedance (e.g., the transmission line impedance, the antenna or load impedance, etc.). This resistive coupling between the split ports may help provide isolation between the split ports.

Adjustable radio-frequency splitter-combiner 50 may also include switching circuitry 56 such as one or more switches and may include any other suitable adjustable components. Control circuitry such as control circuitry 14 and/or one or more processors 26 may provide one or more control signals to the one or more switches that change the states of the one or more switches. If desired, switches in switching circuitry 56 may be implemented using switching transistors or other low impedance switches. As an example, each switch may be changed between an inactive or open state in which the switch forms an open circuit or high impedance path between its two opposing terminals (e.g., opposing source and drain terminals in a switching transistor) and an active or closed state in which the switch forms a shorting circuit or low impedance path between its two opposing terminals.

By including switching circuitry 56 and/or other adjustable components, radio-frequency splitter-combiner 50 may be placed in different configurations to operate in different modes. As a first example, the control circuitry may control switching circuitry 56 to place radio-frequency splitter-combiner 50 in a first configuration for operation when all split ports are being used. As a second example, the control circuitry may control switching circuitry 56 to place radio-frequency splitter-combiner 50 in a second configuration for operation when there is at least one unused split port. Configurable in at least these two configurations, radio-frequency splitter-combiner 50 may operate with minimal power loss even in different operating modes or environments (e.g., when one or more splitter-combiner ports and/or one or more antennas coupled to the one or more splitter-combiner ports are inactive or unused).

These examples are illustrative of only some of many possible configurations that may be used by radio-frequency splitter-combiner 50. If desired, switching circuitry 56 may place radio-frequency splitter-combiner 50 in other suitable configuration for other modes of operation.

The various constituent components such as impedance transformers 52, resistor 54, and switching circuitry 56 described in connection with adjustable radio-frequency splitter-combiner 50 as shown in FIG. 3 are illustrative. If desired, one or more of these components might optionally be excluded from radio-frequency splitter-combiner 50. If desired, radio-frequency splitter-combiner 50 may also include other components necessary to enable adjustment into different suitable configurations for suitable operation.

Figure 4:
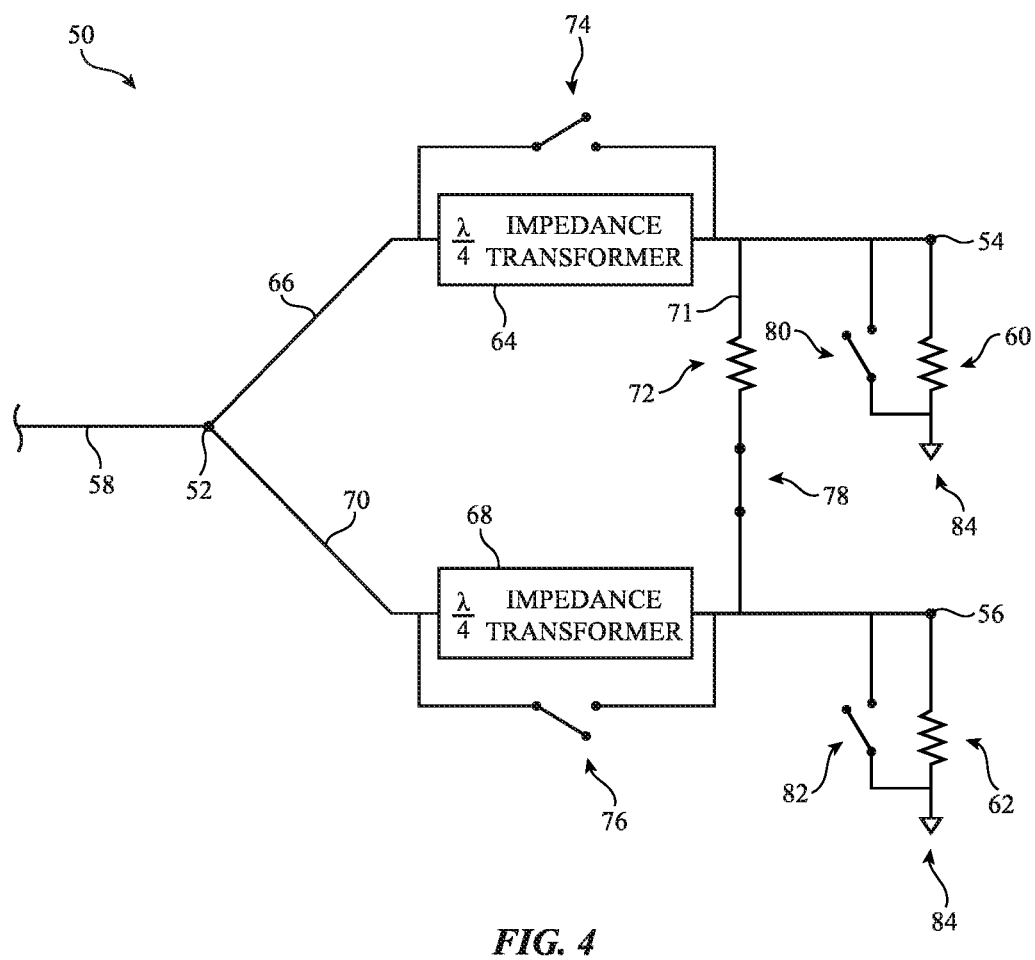
FIG. 4 is a circuit diagram of an illustrative configuration of an adjustable radio-frequency splitter and/or combiner of the type shown in FIG. 3 in accordance with some embodiments.

FIG. 4 is a circuit diagram illustrating one configuration of adjustable radio-frequency splitter-combiner 50. As shown in FIG. 4, splitter-combiner 50 may include a first port 52 (e.g., a combined or merged port), a second port 54 (e.g., a first split port), and a third port 56 (e.g., a second split port). Ports 52, 54, and 56 may sometimes be referred to herein as terminals of the splitter-combiner circuitry.

Port 52 may be connected to a transmission line 58, which is coupled to preceding stages in front end module 40, and ultimately to transceiver circuitry 28 and processors 26 (FIG. 2). Port 54 may be coupled to a first antenna 42 (FIG. 2), which can exhibit a load impedance represented by impedance 60. If desired, port 54 may be coupled to the first antenna 42 through one or more succeeding stages (e.g., additional splitter-combiner stages), in which case, impedance 60 may represent the load impedance of a succeeding stage. Port 56 may be coupled to a second antenna 42 (FIG. 2), which can exhibit a load impedance represented by impedance 62. If desired, port 56 may be coupled to the second antenna 42 through one or more succeeding stages (e.g., additional splitter-combiner stages), in which case, impedance 62 may represent the load impedance of a succeeding stage. The first and second antennas 42 (e.g., represented by impedances 60 and 62) may include separate or shared antenna ground coupled to a reference voltage terminal such as ground voltage terminal 84.

Path 66 may couple port 52 to split port 54, and path 70 may couple port 52 to port 56. Quarter wave impedance transformer 64 may be coupled along path 66 and may be interposed between port 52 and port 54. Configured in this manner, quarter wave impedance transformer 64 may match the impedance of transmission line 58 to impedance 60 (e.g., the impedance of the antenna coupled to port 54). As an example, to perform this impedance matching function, quarter wave impedance transformer 64 may have an impedance that is the characteristic impedance of transmission line 58 (or the antenna impedance) multiplied by the square root of two.

Quarter wave impedance transformer 68 may be coupled along path 70 and may be interposed between port 52 and port 56. Configured in this manner, quarter wave impedance transformer 68 may match the impedance of transmission line 58 to impedance 62 (e.g., the impedance of the antenna coupled to port 56). As an example, to perform this matching function, quarter wave impedance transformer 68 may have an impedance that is the characteristic impedance of transmission line 58 (or the antenna impedance) multiplied by the square root of two.

As such, when both ports 54 and 56 are active, quarter wave impedance transformers 64 and 68 may provide the desired impedance matching functions and minimize power loss when combining or splitting power between split ports 54 and 56.

Adjustable radio-frequency splitter-combiner 50 as shown in FIG. 4 may be a Wilkinson-type splitter-combiner. As such, splitter-combiner 50 may include resistor 72 coupled between port 54 and port 56 along path 71. Placing resistor 72 in this configuration enables splitter-combiner 50 to provide signal isolation between its split ports 54 and 56.

While quarter wave impedance transformers 64 and 68 may suitably perform impedance matching functions to minimize power loss when both ports 54 and 56 are in use, this may not be the case when one of ports 54 and 56 is unused. In one illustrative example where port 56 is unused (e.g., is not used to receive and/or transmit radio-frequency signals), radio-frequency splitter-combiner 50 may exhibit a power loss in conveying signals between port 52 and port 54 in the presence of the unused path 70 and unused port 56. This may be due to quarter wave impedance transformer 64 being configured (e.g., designed) to operate (e.g., impedance match) optimally only in the presence of used path 70 and used port 56.

To mitigate these issues, adjustable radio-frequency splitter-combiner 50 may include switching circuitry with switches 74, 76, 78, 80, and 82 coupled at different locations within radio-frequency splitter-combiner 50. As shown in FIG. 4, switch 74 may be coupled in parallel with quarter wave impedance transformer 64 between port 52 and port 54. Similarly, switch 76 may be coupled in parallel with quarter wave impedance transformer 68 between port 52 and port 56. Switches 74 and 76 may form respective bypass paths that each bypasses the corresponding quarter wave impedance transformer 64 or 68.

Switch 78 may be coupled in series with resistor 72 along path 71 between split ports 54 and 56. Switch 80 may be coupled in parallel with load impedance 60 (e.g., an antenna) between port 54 and a reference voltage terminal such as ground voltage terminal 84. In other words, switch 80 may provide a grounding path to port 54. Similarly, switch 82 may be coupled in parallel with load impedance 62 (e.g., an antenna) between port 56 and a reference voltage terminal such as ground voltage terminal 84. In other words, switch 82 may provide a grounding path to port 56.

Providing these switches enables certain paths in radio-frequency splitter-combiner 50 to be bypassed and other paths in radio-frequency splitter-combiner 50 to be opened (e.g., form an open circuit) based on the desired impedance transformation for each operating mode (e.g., a first mode in which ports 54 and 56 are both in use, a second mode in which port 54 is in use but port 56 is not in use, and a third mode in which port 56 is in use but port 54 is not in use).

In the example of FIG. 4, the states of these switches (e.g., the state of switching circuitry 56) configures radio-frequency splitter-combiner 50 to operate desirably (e.g., with impedance matching on both split paths, with power loss on both split paths below a threshold level, with isolation between the split ports above a threshold level, etc.) when ports 54 and 56 are both in use.

In particular, switch 74 may be in an opened or inactive (non-conductive) state, thereby configuring radio-frequency splitter-combiner 50 to use quarter wave impedance transformer 64 to connect port 52 to port 54. Switch 76 may be in an opened or inactive state, thereby configuring radio-frequency splitter-combiner 50 to use quarter wave impedance transformer 68 to connect port 52 to port 56. Switch 78 may be in a closed or active (conductive) state, thereby enabling resistor 72 to serve its isolation function by being coupled between port 54 and port 56. Switch 80 may be in an open or inactive state, thereby leaving port 54 ungrounded (e.g., not shorted to ground voltage terminal 84). Switch 82 may be in an open or inactive state, thereby leaving port 56 ungrounded (e.g., not shorted to ground voltage terminal 84).

Figure 5:
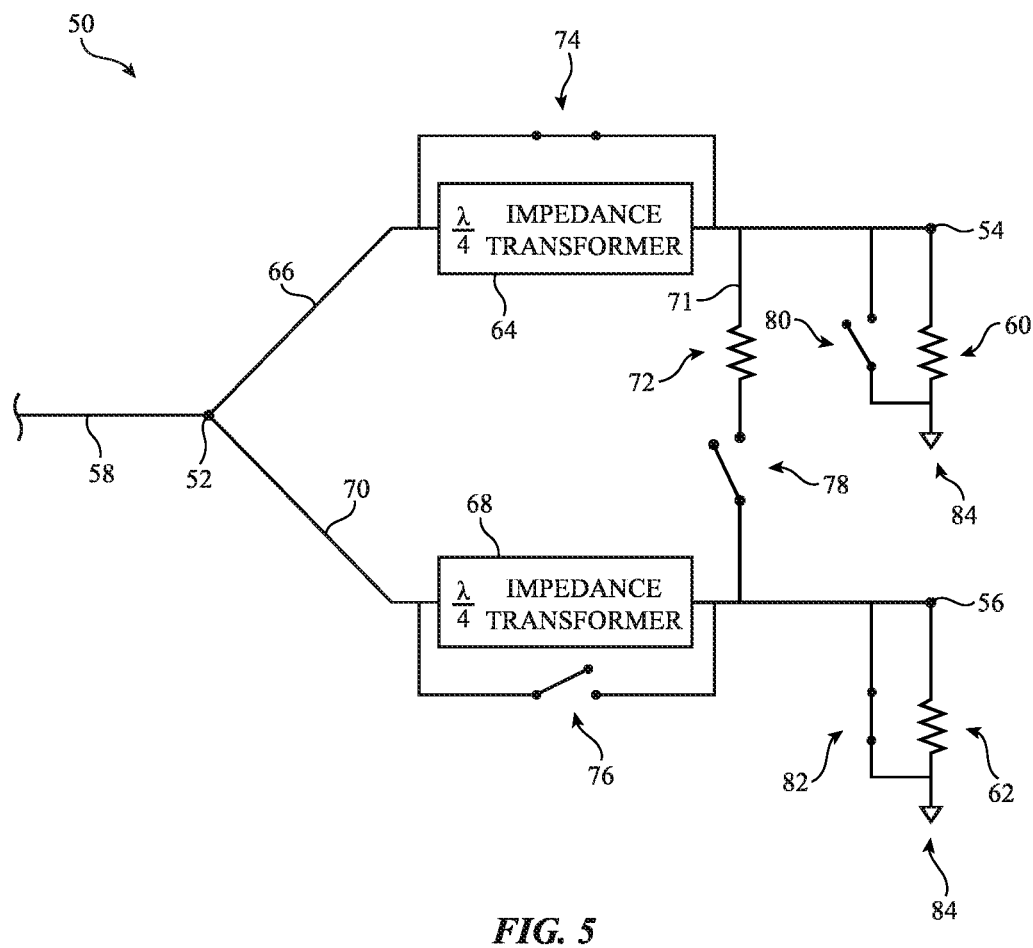
FIG. 5 is a circuit diagram of an illustrative state of the adjustable radio-frequency splitter and/or combiner of the type shown in FIG. 4 with an inactive or unused port in accordance with some embodiments.

FIG. 5 is a circuit diagram illustrating an alternative state of adjustable radio-frequency splitter-combiner 50 (as configured by switching circuitry 56) when port 54 is in use but port 56 is not in use. As shown in FIG. 5, along the unused path 70, switch 76 may be in an open state while switch 82 may be in closed state. Port 56 may also be decoupled from port 54 by placing switch 78 in an open state. Configured in this manner, path 70 coupled to port 56 forms an open circuit from the perspective of port 52.

Along the used path 66, switch 74 may be in a closed state while switch 80 is in an open state. Configured in this manner, quarter wave impedance transformer 64 is bypassed because it is not need to perform the one port to one port impedance matching as the impedance of transmission line 58 may already match the load impedance 60 (e.g., the antenna impedance). This is in contrast with the one to port two port impedance matching performed by impedance transformer 64 when both ports 54 and 56 are in use.

In the example of FIG. 5, the states of these switches (e.g., the state of switching circuitry 56) configures radio-frequency splitter-combiner 50 to operate desirably (e.g., with impedance matching along on the used path and port, with power loss along on the used path and port below a threshold level, with isolation between the split ports above a threshold level, etc.) when port 54 is in use but port 56 is not in use.

In analogous manner, switch circuitry 56 may be placed in a third state to configure radio-frequency splitter-combiner to operate when port 54 is not in use but port 56 is in use. In this third state, switches 76 and 80 may be closed, while switches 74, 78, and 82 may be open.

The configuration in which switching circuitry 56 in radio-frequency splitter-combiner 50 includes five switches 74, 76, 78, 80, and 82 is illustrative of one of many possible configurations of an adjustable radio-frequency splitter-combiner 50. If desired, one or more of these switches may be omitted (e.g., to provide only part of the functionalities described in connection with these five switches, in a scenario where one split port cannot be inactive, etc.), and/or additional switches may be provided at other suitable locations within adjustable radio-frequency splitter-combiner 50.

While FIGS. 4 and 5 show an implementation of impedance transformers 52 (FIG. 3) in radio-frequency splitter-combiner 50 using quarter wave impedance transformers 64 and 68, this is illustrative of one of many possible implementations. If desired, impedance transformers 52 may be implemented using lumped elements or discrete components such as one or more inductors and/or one or more capacitors.

Figure 6:
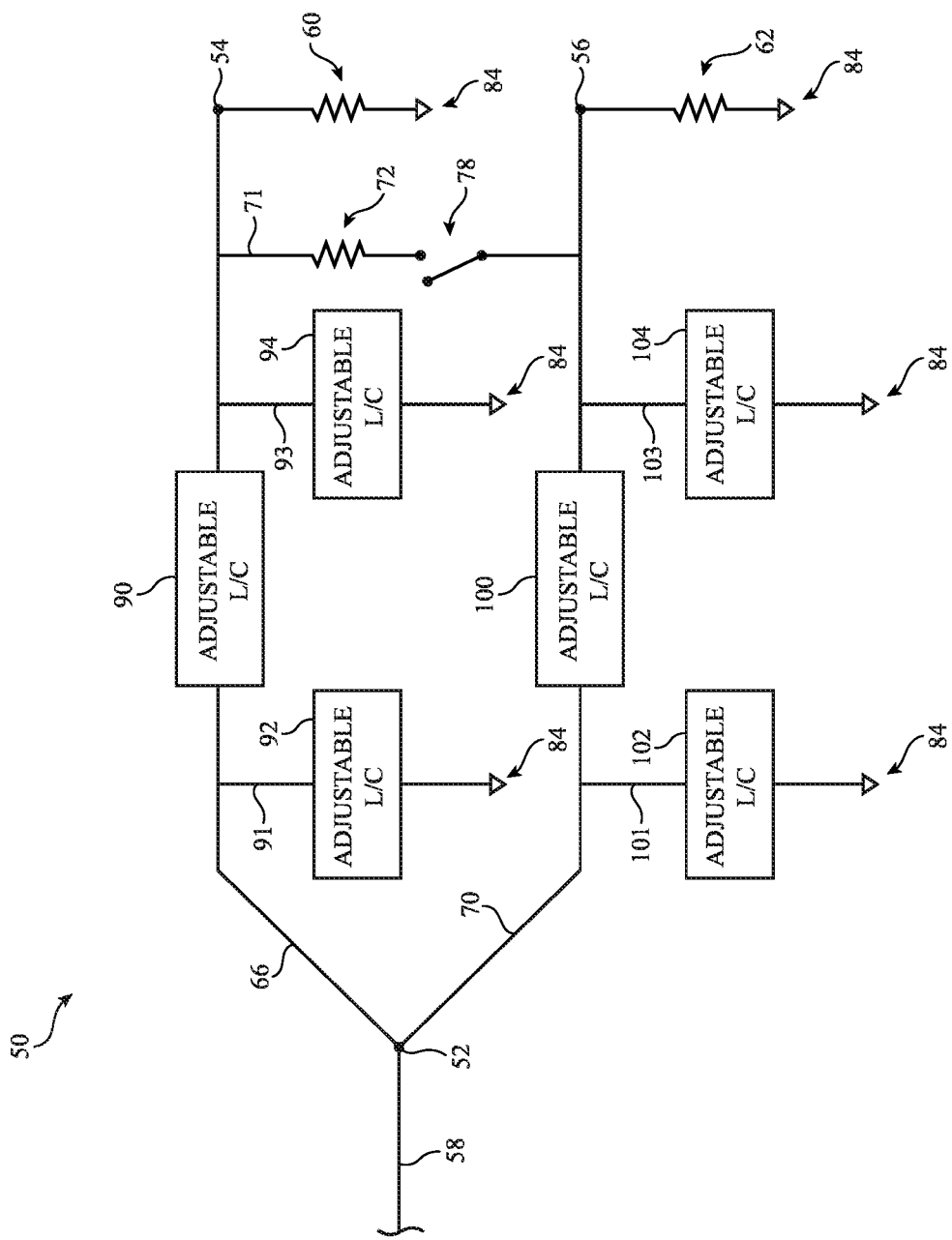
FIG. 6 is a circuit diagram of an additional illustrative configuration of an adjustable radio-frequency splitter and/or combiner of the type shown in FIG. 3 in accordance with some embodiments.

FIG. 6 is a circuit diagram illustrating one configuration of adjustable radio-frequency splitter-combiner 50 having impedance transformers formed from adjustable discrete components or adjustable lumped elements such as one or more inductors and/or capacitors. As shown in FIG. 6, adjustable component 90 may be coupled in series along path 66, adjustable component 92 may be coupled in a shunt configuration to couple path 66 to ground voltage terminal 84 via path 91, and adjustable component 94 may be coupled in a shunt configuration to couple path 66 to ground voltage terminal 84 via path 93. Similarly, adjustable component 100 may be coupled in series along path 70, adjustable component 102 may be coupled in a shunt configuration to couple path 70 to ground voltage terminal 84 via path 101, and adjustable component 104 may be coupled in a shunt configuration to couple path 70 to ground voltage terminal 84 via path 103.

The number and location of these adjustable inductors and/or capacitors as shown in FIG. 6 are illustrative of one or many possible configurations. If desired, one or more adjustable inductors and/or capacitors as shown in FIG. 6 may be omitted, and/or additional adjustable inductors and/or capacitors may be added to the configuration of radio-frequency splitter-combiner 50 shown in FIG. 6. The number and location of inductors and/or capacitors in radio-frequency splitter-combiner 50 may implement any suitable impedance matching network such as an L matching network, a Pi matching network, a T matching network, or any other suitable matching network.

As one example, adjustable component 90 may be an adjustable series inductor while adjustable component 92 may be a first adjustable shunt capacitor and adjustable component 94 may be a second adjustable shunt capacitor. Similarly, adjustable component 100 may be an adjustable series inductor while adjustable component 102 may be a first adjustable shunt capacitor and adjustable component 104 may be a second adjustable shunt capacitor. Configured in this manner, impedance transforming circuitry in radio-frequency splitter-combiner 50 may implement two Pi matching networks. If desired, adjustable component 94 and path 93, and adjustable component 104 and path 103 may be omitted, thereby providing radio-frequency splitter-combiner 50 with two L matching networks. If desired, adjustable component 92 and path 91, and adjust component 102 and path 101 may be omitted, thereby also providing radio-frequency splitter-combiner 50 with two L matching networks.

In a first illustrative configuration, the adjustability of these inductive and capacitive components may be provided by coupling a corresponding bypass switch along a separate bypass path in parallel with each of these inductors or capacitors and/or by coupling a correspond series switch along the path of each of these inductors or capacitors. The state of these switches may be controlled in a similar manner as described above in connection with FIGS. 4 and 5 with respect to the quarter wave impedance transformers to achieve the same affect in the presence of an unused port.

In particular, still referring to the first illustrative configuration, if port 54 is in use while port 56 is unused, a bypass switch coupled in parallel to series inductor 90 may be activated (conductive) to form a shorting path between port 52 and 54, while series switches coupled in series along paths 91 and 93 with respective capacitors 92 and 94 may be opened (non-conductive) to form open circuits. Additionally, a series switch coupled in series with series inductor 100 (and a bypass switch coupled in parallel with series inductor 100) may be opened, while a series switch coupled in series along path 101 with capacitor 102 may also be opened. Switch 78 may also be opened as similarly described in connection with FIG. 5. Configured in this manner, transmission line 58 at port 52 may be impedance matched with the antenna at port 54 along path 66 (and the bypass path bypassing series inductor 90), while an open circuit is provided on path 70 from the perspective of transmission line 58 at port 52.

The principal of adjustment as described in this first illustrative configuration of adjustability as applied to lumped elements is analogous to that described for quarter wave impedance transformers in FIGS. 4 and 5 (e.g., in the one-port configuration, the used port is connected to the combined port via a bypass shorting path while the unused path is disconnected from the combined port via an open circuit.

If desired, in a second illustrative configuration, the adjustability of these inductive and capacitive components may be provided by configuring each of the inductive components with variable inductance values and/or each of the capacitive components with variable capacitance values. In this second illustrative configuration, one or more of these adjustable components (e.g., components 90, 92, 94, 100, 102, and 104) may each be a variable inductor or a variable capacitor.

As a particular example, adjustable component 90 may be implemented using a variable inductor configured to provide a number of inductance values such as a first inductance value for use when both ports 54 and 56 are in use, a second inductance value for use when port 54 is in use but port 56 is unused, and a third inductance value for use when port 56 is in use but port 54 is unused. If desired, two of these inductance values may be the same. In this particular example, adjustable component 92 may be implemented using a variable capacitor configured to provide a number of different capacitance values such as a first capacitance value for use when both ports 54 and 56 are in use, a second capacitance value for use when port 54 is in use but port 56 is unused, and a third capacitance value for use when port 56 is in use but port 54 is unused. If desired, two of these capacitance values may be the same. The other adjustable inductor and/or capacitor components may be configured in a similar manner (e.g., with a variable inductance or capacitance property)

If desired, the variable inductance may be provided by an inductor bank such as a set of inductors having different fixed inductance values coupled in parallel and/or series, one or more of which are desirably activated or selected via switches. Similarly, if desired, the variable capacitance may be provided by a capacitor bank such as a set of capacitors having different fixed capacitance values coupled in parallel and/or series, one or more of which are desirably activated or selected via switches.

By providing variable inductance and capacitance values, adjustable radio-frequency splitter-combiner 50 may be configured in the most optimal state in terms of impedance matching, in terms of power loss, etc., for each operating mode (e.g., when ports 54 and 56 are both in use or when one of the two ports 54 and 56 is not in use).

As described in connection with FIGS. 4-6, switches in radio-frequency splitter-combiner 50 forming switching circuitry 56 may each be placed in a particular state depending on the operation of wireless circuitry 24 such as in response to or based at least in part on determining which antennas and therefore antenna ports are used. If desired, control circuitry for the switches such as one or more processors 26 or other processors in wireless circuitry 24 (FIG. 2), and/or control circuitry 14 in device 10 (FIG. 1) may provide a control signal to each of the switches along a control path (shared or separate from the other switches) to place that switch in the desired state. In the example in which the switches are implemented using switching transistors, the control signal may be provided to the gate terminal of each of the switching transistors.

Referring to FIG. 4 as an example, wireless circuitry 24 (e.g., one or more processors 26) may determine that the two antennas respectively coupled to ports 54 and 56 are to be used in transmission and/or reception. The control circuitry for the switches may provide one or more control signals to each switch in switching circuitry 56 to place switches 74, 76, 78, 80, and 82 in the configuration shown in FIG. 4 based on the determination that ports 54 and 56 are both to be used.

Referring to FIG. 5 as another example, wireless circuitry 24 (e.g., one or more processors 26) may determine that the antenna coupled to port 54 is to be used in transmission and/or reception while the antenna coupled to port 56 is to be unused. The control circuitry for the switches may provide one or more control signals to each switch in switching circuitry 56 to place switches 74, 76, 78, 80, and 82 in the configuration shown in FIG. 5 based on the determination that port 54 is to be used while port 56 is to be unused.

While in the examples of FIGS. 4-6, adjustable radio-frequency splitter-combiner 50 are implemented as a one-to-two (e.g., one combined port to two split ports) splitter-combiner, this is illustrative of one of many possible configurations for an adjustable radio-frequency splitter-combiner.

Figure 7:
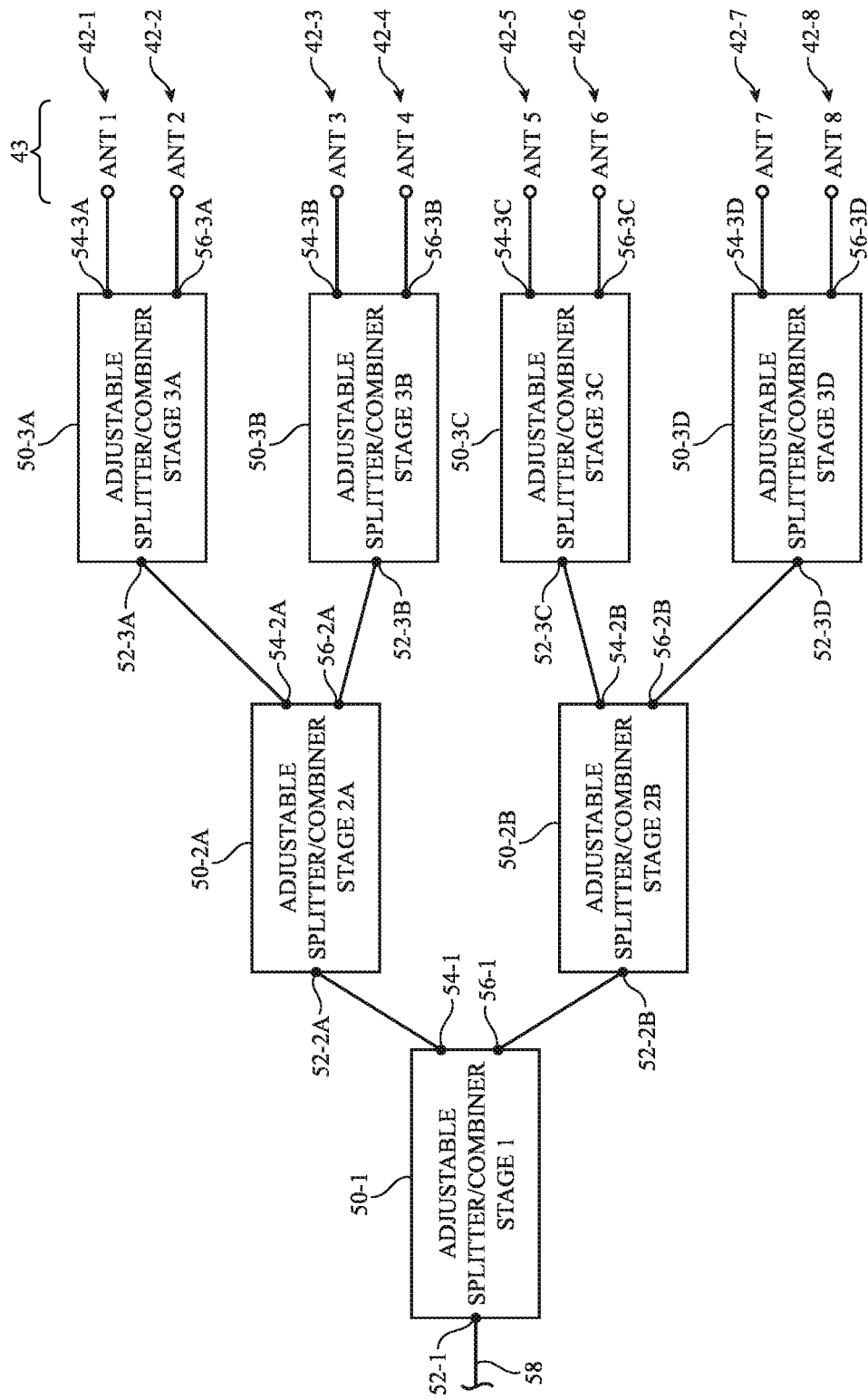
FIG. 7 is a diagram of an adjustable radio-frequency splitter and/or combiner having multiple stages in accordance with some embodiments.

FIG. 7 is an illustrative diagram of an adjustable radio-frequency splitter-combiner having multiple one-to-two splitter-combiner stages, collectively implementing a one-to-eight splitter-combiner that may be implemented in wireless circuitry 24 (e.g., as part of splitter-combiner 50 in front-end module 40 in FIG. 2). As shown in FIG. 7, the one-to-eight splitter-combiner may have one combined port 52-1 coupled to transmission line 58, through which the one-to-eight splitter-combiner is coupled to other proceeding stages such as amplifier stages in front end module 40. The one-to-eight splitter-combiner may have eight split ports 54-3A, 56-3A, 54-3B, 56-3B, 54-3C, 56-3C, 54-3D, and 56-3D. Each of the eight split ports may be coupled to respective antennas 42-1, 42-2, 42-3, . . . , 42-8. These eight antennas may form an antenna array such as a phased antenna array 43. In other words, combinations (e.g., sets and subsets) of these eight antennas may be used to form a combined transmit or receive beam resulting from the combined radiation patterns of the combination of the antennas.

In particular, each of antennas 42 may include one or more antenna resonating elements such as a patch antenna resonating element, one or more parasitic elements, one or more tuning elements, and one or more other antenna elements. Accordingly, antenna array 43 may also include an array of antenna elements (e.g., an array of antenna resonating elements, each coupled to parasitic elements, tuning elements, etc.).

To implement the one-to-eight splitting/combining scheme, the adjustable one-to-eight splitter-combiner may include seven adjustable one-to-two splitter-combiner stages 50-1, 50-2A, 50-2B, 50-3A, 50-3B, 50-3C, and 50-3D. Each of these seven stages may be implemented based on an instance of adjustable radio-frequency splitter-combiner 50 as described in connection with FIGS. 4 and 5 or FIG. 6 (using lumped elements), or described generally in connection with FIG. 3.

In the example of FIG. 7, stage 50-1 may couple combined port 52-1 to split ports 54-1 and 56-1 via two respective split paths (e.g., corresponding paths 66 and 70 in FIG. 4 or in FIG. 6). Stage 50-2A may couple combined port 52-2A to split ports 54-2A and 56-2A via two respective split paths. Combined port 52-2A of stage 50-2A may be coupled to split port 54-1 of stage 50-1. Stage 50-2B may couple combined port 52-2B to split ports 54-2B and 56-2B via two respective split paths. Combined port 52-2B of stage 50-2B may be coupled to split port 56-1 of stage 50-1. Stage 50-3A may couple combined port 52-3A to split ports 54-3A and 56-3A via two respective split paths. Combined port 52-3A of stage 50-3A may be coupled to split port 54-2A of stage 50-2A. Stage 50-3B may couple combined port 52-3B to split ports 54-3B and 56-3B via two respective split paths. Combined port 52-3B of stage 50-3B may be coupled to split port 56-2A of stage 50-2A. Stage 50-3C may couple combined port 52-3C to split ports 54-3C and 56-3C via two respective split paths. Combined port 52-3C of stage 50-3C may be coupled to split port 54-2B of stage 50-2B. Stage 50-3D may couple combined port 52-3D to split ports 54-3D and 56-3D via two respective split paths. Combined port 52-3D of stage 50-3D may be coupled to split port 56-2B of stage 50-2B.

In other words, stages 50 may each include two split paths along which adjustable components such as switches (e.g., as described in connection with FIGS. 4-6), and/or variable capacitor and inductors (e.g., as described in connection with FIG. 6) are coupled. These adjustable components may be placed in different states (e.g., open or closed states for switches, states that exhibit different capacitance or inductive values, etc.) based on which of the eight antennas 42 are in use (and consequently based on which of the eight split ports coupled antennas 42 are in use) to improve impedance matching characteristics and minimize power loss as described in connection with FIGS. 3-6.

Take as an example a scenario in which only two antennas 42-1 and 42-3 are used out of the eight antennas in antenna array 43 (e.g., only antennas 42-1 and 42-3 are used in a beam forming operation for phased antenna array 43). Accordingly, the control circuitry for the adjustable components (e.g., switches) may place each of the adjustable component coupled along each split path in each stage 50 to optimize for ports 54-3A and 54-3B being the only ports used (e.g., the remaining are inactive or unused).

In particular, in this scenario, the control circuitry for the switches may place switching circuitry 56 (e.g., switches) in stage 50-1 in the state shown in FIG. 5 (e.g., to operate stage 50-1 with port 54-1 being used and port 56-1 being unused). The control circuitry for the switches may place switching circuitry 56 in stage 50-2A in the state shown in FIG. 4 (e.g., to operate stage 50-2A with port 54-2A and port 56-2A both being used). The control circuitry for the switches may place switching circuitry 56 in stage 50-3A in the state shown in FIG. 5 (e.g., to operate stage 50-3A with port 54-3A being used and port 56-3A being unused). The control circuitry for the switches may place switching circuitry 56 in stage 50-3B in the state shown in FIG. 5 (e.g., to operate stage 50-3B with port 54-3B being used and port 56-3B being unused). The control circuitry for the switches may place switches in switching circuitry 56 in stages 50-2B, 50-3C, and 50-3D all in open states since none of the ports 54-3C, 56-3C, 54-3D, and 56-3D are used.

This example described in connection with antennas 42-1 and 42-3 and their corresponding split antenna ports being active is illustrative of one of many possible scenarios (e.g., modes of operation) for the one-to-eight splitter-combiner shown in FIG. 7. If desired, any combination of antennas and their corresponding split antenna ports may be active, and the control circuitry for the switches may place switching circuitry 56 in each of the stages in the corresponding configuration that enables impedance matching and power loss reduction.

While this example was described in connection with the illustrative configurations of splitter-combiner 50 as described in FIGS. 4 and 5, each splitter-combiner stage 50 in the one-to-eight splitter-combiner may use one of the many illustrative configurations described in connection with FIG. 6 for splitter-combiner 50, if desired.

The configuration for a one-to-eight splitter-combiner as shown in FIG. 7 is also illustrative of one of many possible illustrative configurations for splitter-combiners having multiple stages. If desired, wireless circuitry 24 may include an adjustable one-to-four splitter-combiner, an adjustable one-to-sixteen splitter-combiner, an asymmetric adjustable splitter-combiner such as a one-to-seven splitter-combiner (e.g., if stage 50-3D in FIG. 7 is omitted), a one-to-six splitter-combiner (e.g., if stages 50-3C and 50-3D in FIG. 7 is omitted), or generally any one-to-N splitter-combiner formed from one or more suitably arranged one-to-two splitter-combiner stages 50 as described in connection with FIGS. 4-6. In other words, any of these one-to-N splitter-combiners may utilize switching circuitry and/or adjustable capacitances and impedances to configure the one-to-N splitter-combiner in a number of different states based on the number of active and inactive split ports (e.g., the number of active and inactive antennas coupled to the active and inactive split ports).

The methods and operations described above in connection with FIGS. 1-7 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include one or more microprocessors, application processors, digital signal processors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. A radio-frequency splitter-combiner comprising:
impedance matching circuitry coupled between a combined port of the radio-frequency splitter-combiner and two split ports of the radio-frequency splitter-combiner; and
switching circuitry coupled to the impedance matching circuitry and exhibiting a first state when a single port of the two split ports is in use and exhibiting a second state when both ports of the two split ports are in use.

2. The radio-frequency splitter-combiner of claim 1, wherein the switching circuitry comprises a switch coupled along a path that bypasses a portion of the impedance matching circuitry.

3. The radio-frequency splitter-combiner of claim 2, wherein the switch is activated in the first state to use the path that bypasses the portion of the impedance matching circuitry.

4. The radio-frequency splitter-combiner of claim 2, wherein
the switching circuitry comprises an additional switch coupled along an additional path that bypasses an additional portion of the impedance matching circuitry,
the portion of the impedance matching circuitry is between the combined port and a first split port of the two split ports, and
the additional portion of the impedance matching circuitry is between the combined port and a second split port of the two split ports.

5. The radio-frequency splitter-combiner of claim 4, wherein
the switch is activated in the first state to use the path that bypasses the portion of the impedance matching circuitry,
the additional switch is deactivated in the first state, and
the single port in use is the first split port.

6. The radio-frequency splitter-combiner of claim 5, wherein the switch and the additional switch are both deactivated in the second state.

7. The radio-frequency splitter-combiner of claim 1 further comprising:
a resistor coupled between the two split ports, the switching circuitry having a switch coupled in series with the resistor.

8. The radio-frequency splitter-combiner of claim 7, wherein the switch is deactivated in the first state to decouple the two split ports.

9. The radio-frequency splitter-combiner of claim 8, wherein the switch is activated in the second state.

10. The radio-frequency splitter-combiner of claim 1, wherein the switching circuitry includes a first switch coupling a first split port of the two split ports to a ground voltage terminal and a second switch coupling a second split port of the two split ports to the ground voltage terminal.

11. The radio-frequency splitter-combiner of claim 10, wherein
the first switch is deactivated in the first state to decouple the first split port from the ground voltage terminal, and
the second switch is activated in the first state to ground the second split port.

12. The radio-frequency splitter-combiner of claim 11, wherein the first switch and the second switch are both deactivated in the second state.

13. Radio-frequency splitter-combiner circuitry comprising:
a first impedance transformer coupling a first port of the radio-frequency splitter-combiner circuitry to a second port of the radio-frequency splitter-combiner circuitry;
a second impedance transformer coupling the first port to a third port of the radio-frequency splitter-combiner circuitry;
a first switch configured to selectively ground the second port; and
a second switch configured to selectively ground the third port.

14. The radio-frequency splitter-combiner circuitry of claim 13 further comprising:

a resistor coupled between the second port and the third port.

15. The radio-frequency splitter-combiner circuitry of claim 14 further comprising:
a third switch coupled in series with the resistor.

16. The radio-frequency splitter-combiner circuitry of claim 15 further comprising:
a fourth switch coupled across the first impedance transformer; and
a fifth switch coupled across the second impedance transformer.

17. The radio-frequency splitter-combiner circuitry of claim 13, wherein the first impedance transformer comprises a first quarter wave impedance transformer and the second impedance transformer comprises a second quarter wave impedance transformer.

18. An electronic device comprising:
a phased antenna array having a plurality of antennas; and
a radio-frequency splitter-combiner having a combined port and a plurality of split ports, each split port being coupled to a corresponding antenna in the plurality of antennas, the radio-frequency splitter-combiner including:
impedance matching circuitry, and
switching circuitry configured to exhibit different states based on a number of split ports in the plurality of split ports that is in use.

19. The electronic device of claim 18, wherein the switching circuitry includes a switch coupled in parallel with a portion of the impedance matching circuitry.

20. The electronic device of claim 18 further comprising:
one or more processors configured to provide one or more control signals to the switching circuitry based on a first set of split ports in the plurality of split ports that is in use and based on a second set of split ports in the plurality of split ports that is not in use.

* * * * *